(12) United States Patent
Wang et al.

(10) Patent No.: US 6,489,602 B1
(45) Date of Patent: Dec. 3, 2002

(54) IMAGE SCANNER HAVING DRIVING MECHANISM TO SYNCHRONIZE MOVEMENT OF TRANSMISSION-MODE LIGHT SOURCE AND IMAGE PICKUP DEVICE

(75) Inventors: Ping-Chih Wang, Yunlin (TW); Jacky Tseng, Hsinchu (TW)

(73) Assignee: Mustek Systems Inc. (TW)

( * ) Notice: Subject to any disclaimer, the term of this patent is extended or adjusted under 35 U.S.C. 154(b) by 92 days.

(21) Appl. No.: 09/698,822

(22) Filed: Oct. 26, 2000

(51) Int. Cl.[7] ............................................... H01L 27/00
(52) U.S. Cl. ..................... 250/208.1; 250/234; 358/474
(58) Field of Search ...................... 250/208.1, 234–236; 358/474, 475, 483, 487, 494, 497, 506, 509; 399/211

(56) References Cited

U.S. PATENT DOCUMENTS

| 5,251,072 A | 10/1993 | Fukuoka et al. | ............ 359/896 |
|---|---|---|---|
| 5,696,609 A | * 12/1997 | Cresens et al. | ............. 358/474 |
| 5,895,914 A | 4/1999 | Tsai | ............................ 250/234 |
| 5,898,171 A | * 4/1999 | McConica et al. | .......... 250/234 |
| 6,229,628 B1 | * 5/2001 | Takeuchi | ..................... 358/475 |
| 6,233,065 B1 | * 5/2001 | Lee | ............................. 358/475 |
| 6,304,358 B1 | * 10/2001 | Lin et al. | .................... 359/196 |

OTHER PUBLICATIONS

U.S. patent application Ser. No. 09/007,641.

* cited by examiner

Primary Examiner—Kevin Pyo
Assistant Examiner—Seung C. Sohn
(74) Attorney, Agent, or Firm—MacPherson Kwok Chen & Heid LLP

(57) ABSTRACT

An image scanner having a driving mechanism to synchronize the movement of a transmission-mode light source and a carriage mounted therein an image pickup device is disclosed. The driving mechanism includes a driving motor and two transmission devices both connected to the driving motor. One of the transmission devices connects the carriage to the motor. The other transmission device penetrates through the scanning platform at an upper end where an upper cover and a lower housing of the scanner housing are pivotally connected to connect the transmission-mode light source to the motor. Thereby, the two transmission devices are simultaneously driven by the motor to move the carriage and the transmission-mode light source synchronously.

14 Claims, 11 Drawing Sheets

IMAGE SCANNER HAVING DRIVING MECHANISM TO SYNCHRONIZE MOVEMENT OF TRANSMISSION-MODE LIGHT SOURCE AND IMAGE PICKUP DEVICE

FIELD OF THE INVENTION

The present invention relates to an image scanner, and more particularly to an image scanner which includes a single driving device to synchronously move a transmission-mode light source and an image pickup device located on opposite sides of a scanning platform.

BACKGROUND OF THE INVENTION

For an image scanner for scanning a reflective document such as a photo or a paper document, the light source 14 is generally enclosed in a carriage 15 together with an image pickup device including a mirror set 16, a lens device 17 and a charge-coupled device (CCD) 18, as shown in FIG. 1A. The light from the light source 14 is reflected off of the document 10 and received by the image pickup device 16, 17, 18 to realize the image data of the document. By moving the carriage 15 across the document 10 placed on a scanning platform 20 to be scanned, a scanning operation, so called as a reflection-mode scanning, is performed. The light source 14 is referred as a reflection-mode light source herein. Owing to the integration of the light source 14, mirror set 16, lens device 17 and CCD 18 in the carriage 15, only one driving device 12 is required to move the light source and the image pickup device across the document. The driving device 12 generally includes a motor 191 and plural gears 192.

On the other hand, for an image scanner for scanning a penetrative document such as a negative film, a projecting film or a slide, the image pickup device including the mirror set 16, lens device 17, and CCD 18 is enclosed in the carriage 15, and the light source 13 is disposed opposite to the carriage 15 relative to the scanning platform 20, as shown in FIG. 1B. The light from the light source 13 penetrates through the document 10 and received by the image pickup device 16, 17, 18 to realize the image data of the document. By moving the carriage 15 across the document 10 placed on the scanning platform 20 to be scanned, a scanning operation, so called as a transmission-mode scanning, is performed. The light source 13 is referred as a transmission-mode light source herein. Owing to the separation of the light source and the image pickup device, one driving device 11 is required to move the transmission-mode light source 13, and another driving device 12 is required to move the carriage 15.

For a dual-mode image scanner, a transmission-mode scanning or a reflection-mode scanning is performed optionally. For sharing a single image pickup device which is relatively expensive, both of the transmission-mode and the reflection-mode light sources are required, as shown in FIG. 1C. In the conventional dual-mode image scanner, the two driving devices 11 and 12 are used to move the transmission-mode light source 13 and the reflection-mode light source 14 which is mounted in the carriage 15 together with the mirror set 16, the lens device 17 and the CCD 18, respectively. According to the type of the document 10 to be scanned, either one of the transmission-mode light source 13 and the reflection-mode light source 14 is energized. When a transmission-mode scanning is performed, it is necessary for the transmission-mode light source 13 to be synchronously moved with the carriage 15 in order to allow the light emitted therefrom and penetrating through the document 10 to precisely reach the mirror set 16 and further the lens device 17 and the CCD 18. In other words, it is important to perfectly synchronize the movement of the light source 13 with that of the carriage 15. However, such a synchronizing operation is not easy to achieve. Further, owing to the presence of two driving devices including motors 191 and gears 192, the image scanner may be undesirably bulky.

For reducing to a single driving device, a driving mechanism as shown in FIG. 2 is suggested to simultaneously move the transmission-mode light source and the carriage. Similar to the image scanner of FIG. 1, the reflection-mode light source (not shown) is mounted in a carriage 25 which is moved by a driving device. In this image scanner, two guiding slots 211 beside the scanning window 29 are created, and two connecting rods 212 are provided. The two opposite connecting rods 212 penetrate the slots 211 and connect the transmission-mode light source 23 to the carriage 25. With the driving of a motor and gears (not shown, with reference to FIG. 1), the carriage 25 transmits the light source 23 connected therewith through the connecting rods to move synchronously. Therefore, only one set of driving motor and gears is required, and no misalignment problem will occur. U.S. Pat. No. 5,251,072, which is incorporated herein for reference, also describes a similar driving mechanism to synchronize the movement of the transmission-mode and the reflection-mode light sources.

The image scanner of FIG. 2, though omitting one set of motor and gears to possibly reduce the thickness of the scanner housing, requires additional width to create the two guiding slots. Furthermore, the presence of the guiding slots renders contaminants such as dusts to have a chance to enter the lower housing where the important optical devices are accommodated.

SUMMARY OF THE INVENTION

Therefore, an object of the present invention is to provide a dual-mode image scanner, in which a single driving device is used to synchronize the movement of a transmission-mode and a reflection-mode light sources without creating any long slots beside a scanning window.

Another object of the present invention is to provide a transmission-mode image scanner, in which a single driving device is used to synchronize the movement of a light source and an image pickup device enclosed in a carriage precisely and conveniently.

According to the present invention, an image scanner includes a scanning platform for placing thereon a document to be scanned, a housing including a lower housing, and an upper cover pivotally connected to the lower housing at an upper end of the scanning platform, a transmission-mode light provider accommodated in the housing for providing a light signal for the document to be scanned, an image pickup device accommodated in said housing at a side of the scanning platform opposite to the transmission-mode light provider for receiving an image signal from the document in response to the light signal, and converting the image signal into an electronic signal, and a driving device connected between the transmission-mode light provider and the image pickup device for synchronously moving the transmission-mode and the image pickup device.

According to the present invention, the driving device includes a driving element for simultaneously providing a driving force for the transmission-mode light provider and the image pickup device, a first transmission device connected between the driving element and the image pickup device for moving the reflection-mode light provider in response to the driving force, and a second transmission device connected between the driving element and the transmission-mode light provider for moving the transmission-mode light provider in response to the driving force.

According to the present invention, the first or the second transmission devices penetrates through the scanning platform at the upper end, depending on the positions of the transmission-mode light provider, the image pickup device, and the driving element.

For example, if the transmission-mode light provider is located in the upper cover, and the driving element and the image pickup device are located in the lower housing, then the first transmission device are located in the lower housing, and the second transmission device penetrates through the scanning platform at the upper end.

Preferably, the driving element is a motor.

Preferably, the second transmission device includes a roller mounted in the lower housing beneath the upper end of the scanning platform, and driven to rotate by the motor, a first pulley mounted in the upper cover above a lower end of the scanning platform opposite to the upper end, and a cyclic transmission line penetrating through the scanning platform, attached thereto the transmission-mode light provider, hitching the first pulley and the roller, and rotating with the roller with the aid of the first pulley for moving the transmission-mode light provider across the scanning platform.

Preferably, the cyclic transmission line is made of a flexible material. More preferably, the second transmission device further includes two second pulleys arranged between the roller and the first pulley and adjacent to the upper end of the scanning platform for sustaining thereagainst the cyclic transmission line when the upper cover is lifted. Particularly preferably, the cyclic transmission line is inserted thereinto a section of buffering device, e.g. a stretching spring element, for improving the tensile strength thereof so as to minimize vibration of the transmission-mode light provider resulting from the driving force.

Preferably, the image pickup device is mounted in a carriage which is connected to and moved by the first transmission device.

If the image scanner further includes a reflection-mode light provider to function as a dual-mode image scanner, the reflection-mode light provider is preferably mounted in the carriage.

The types of the transmission-mode light provider and the reflection-mode light provider may vary.

In an embodiment, the transmission-mode light provider includes a first lamp energized to provide the light signal for the document when a transmission-mode scanning operation is performed, and the reflection-mode light provider includes a second lamp energized to provide the light signal for the document when a reflection-mode scanning operation is performed. U.S. Pat. No. 5,251,072 provides an example for these types of transmission-mode and the reflection-mode light providers.

In another embodiment, the transmission-mode light provider includes a first lamp energized to provide the light signal for the document when a transmission-mode scanning operation is performed, and the reflection-mode light provider includes a mirror set reflecting light from the first lamp to the document as the light signal when a reflection-mode scanning operation is performed. A pending U.S. patent application Ser. No. 09/007,641, which is assigned to the same assignee as the present application and is incorporated herein for reference, provides an example for these types of transmission-mode and the reflection-mode light providers.

In a further embodiment, the reflection-mode light provider includes a second lamp energized to provide the light signal for the document when a reflection-mode scanning operation is performed, and the transmission-mode light provider includes a mirror set reflecting light from the second lamp to the document as the light signal when a transmission-mode scanning operation is performed. U.S. Pat. No. 5,895,914, which is incorporated herein for reference, provides an example for these types of transmission-mode and the reflection-mode light providers.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
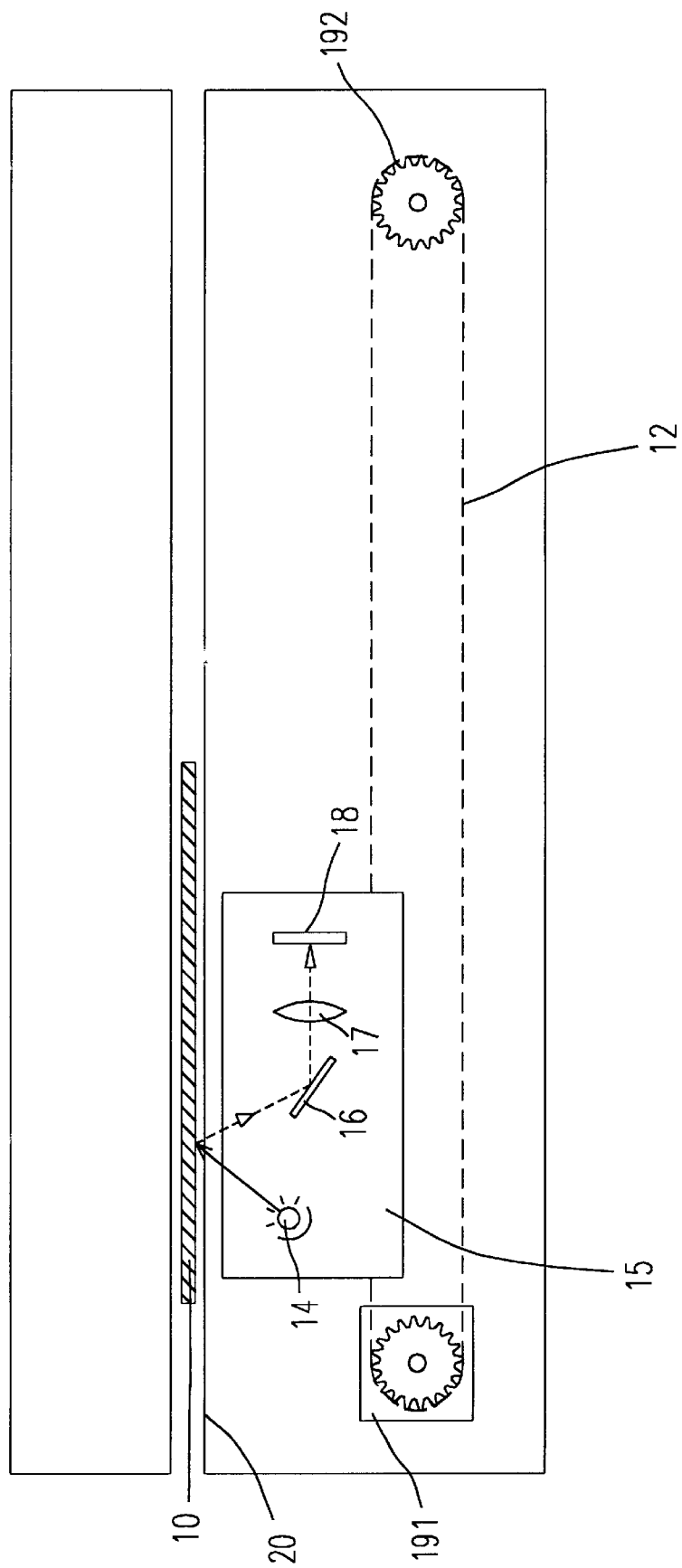
FIG. 1A is a schematic side view of a conventional reflection-mode image scanner.
Figure 1B:
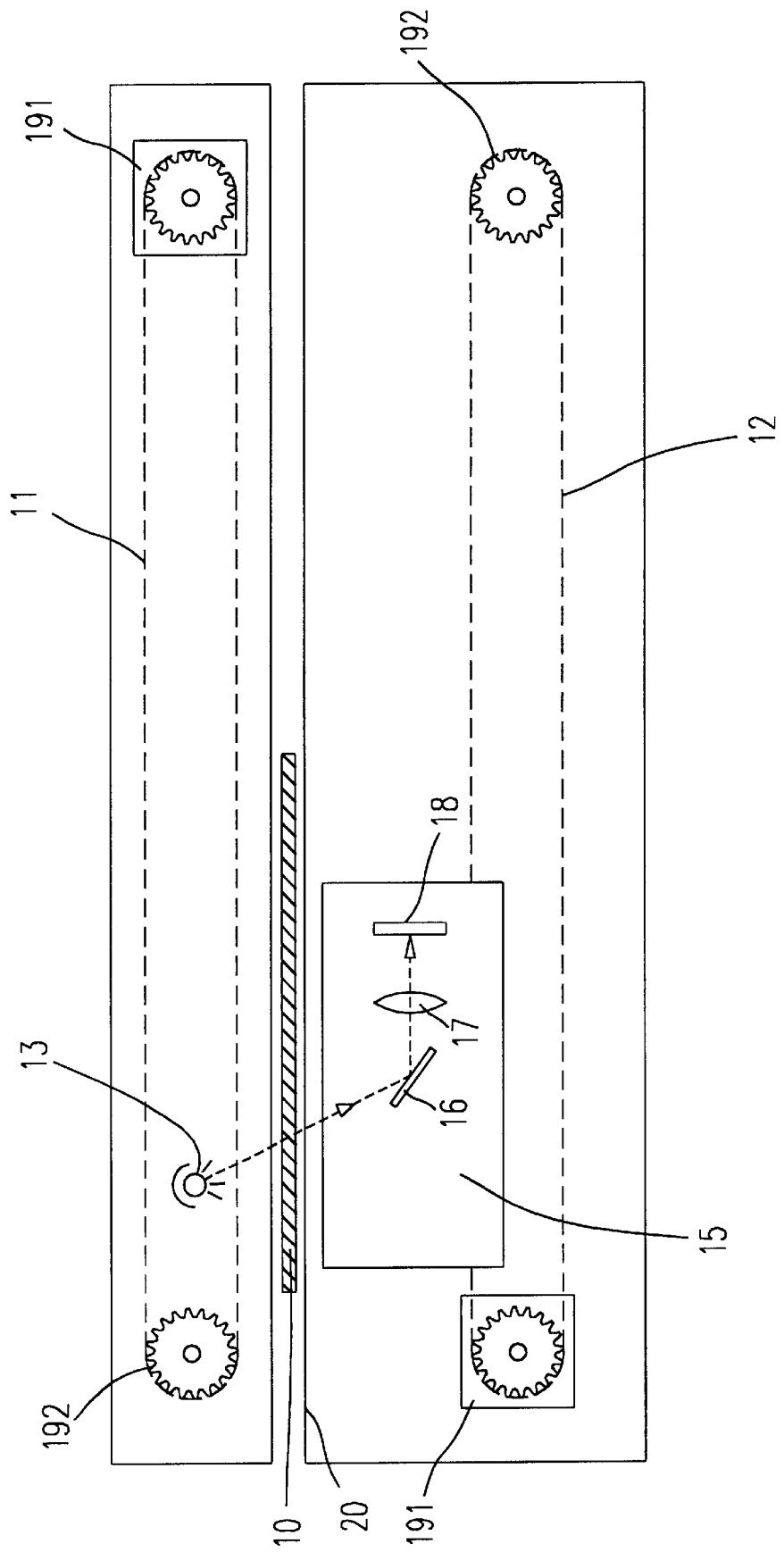
FIG. 1B is a schematic side view of a conventional transmission-mode image scanner.
Figure 1C:
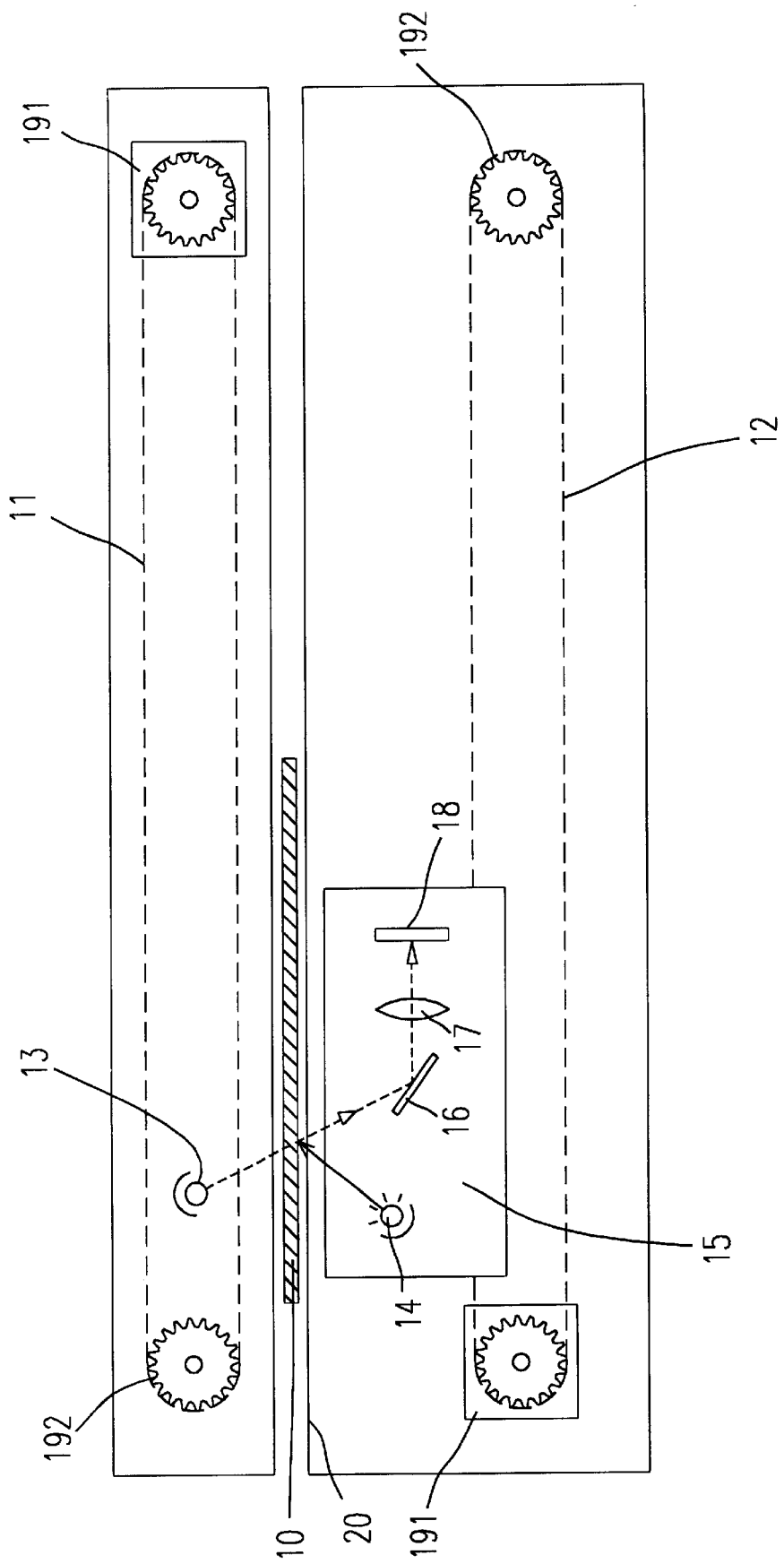
FIG. 1C is a schematic side view of a first conventional dual-mode image scanner.
Figure 2:
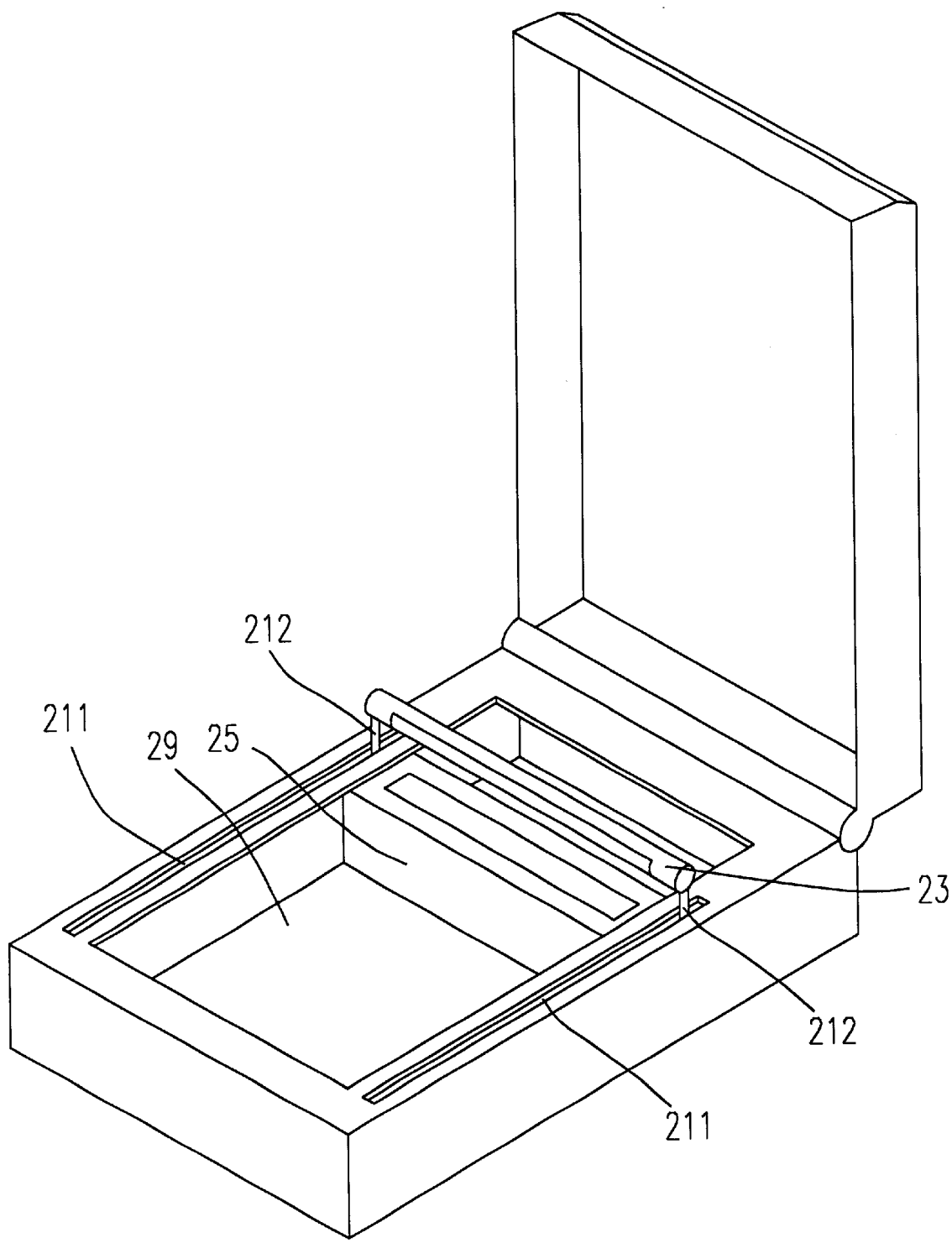
FIG. 2 is a schematic perspective view of a second conventional dual-mode image scanner.
Figure 3A:
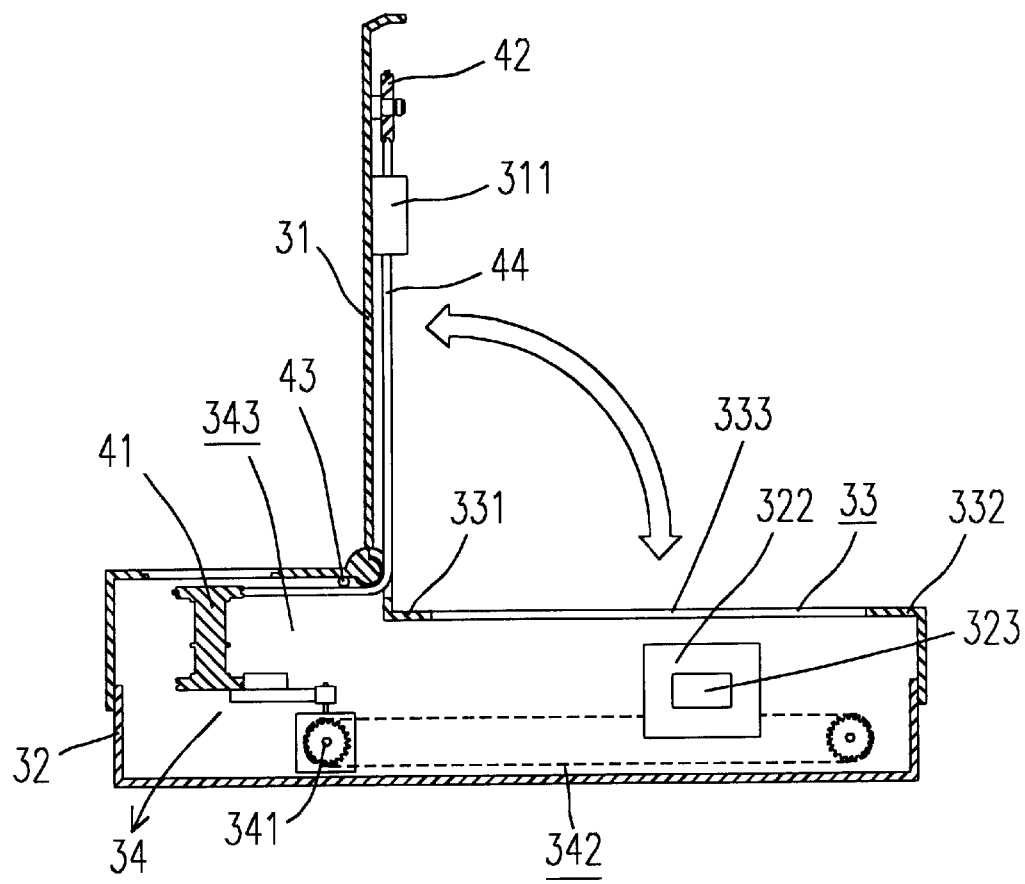
FIG. 3A is a schematic side view of a preferred embodiment of a dual-mode image scanner according to the present invention, in which the upper cover is at an open position.
Figure 3B:
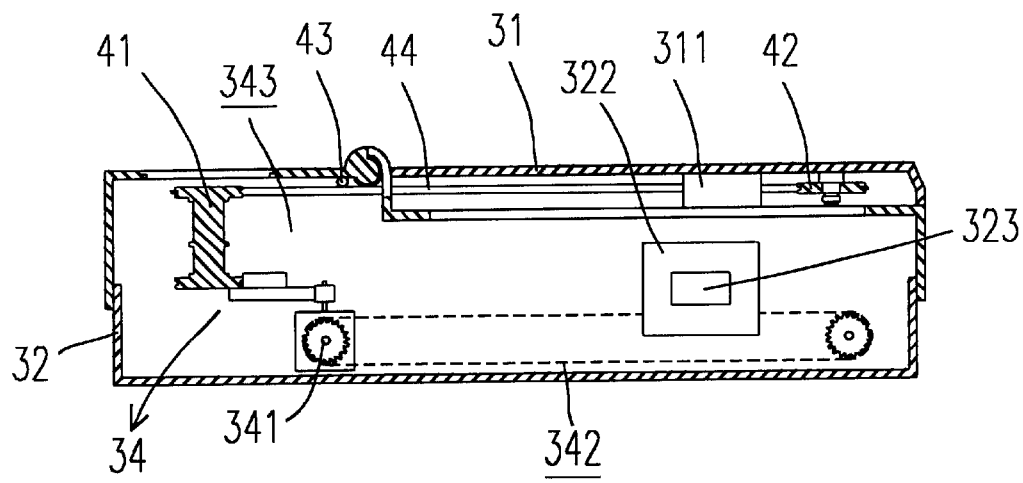
FIG. 3B is another schematic side view of the image scanner of FIG. 3A, in which the upper cover is at a closed position.
Figure 3C:
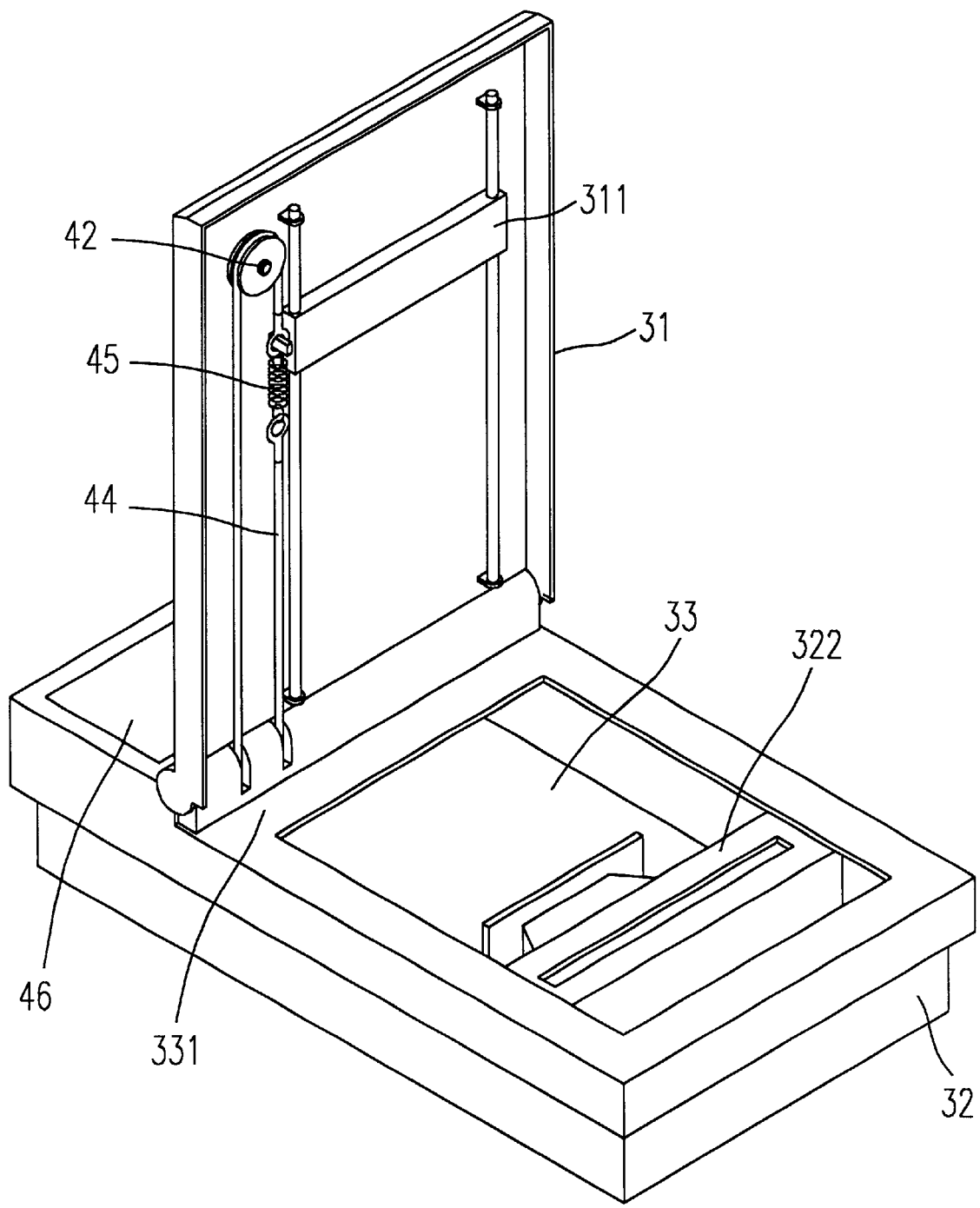
FIG. 3C is a schematic perspective view of FIG. 3A.

Please refer to FIGS. 3A~3D which schematically show a preferred embodiment of an image scanner according to the present invention. The image scanner includes an upper cover 31 and a lower housing 32 which are pivotally connected with each other as a scanner housing. Between the upper cover 31 and the lower housing 32, a scanning platform 33 is located for placing thereon a document to be scanned. As shown in FIG. 3C, the upper cover 31 and the lower housing 32 are connected at an upper end 331 of the scanning platform 33.

Inside the image scanner housing, a transmission-mode light provider 311 is accommodated in the upper housing 31, and a carriage 322 is accommodated in the lower housing 32. The carriage 322 is mounted therein an image pickup device 323 consisting of a mirror set, a lens device and a charge-coupled device (CCD) (not shown). Between the transmission-mode light provider 311 and the carriage 322, a driving device 34 is provided to connect the transmission-mode light provider 311 with the carriage 322 in order to move them synchronously.

The driving device 34 includes a driving motor 341 for providing a driving force, a first transmission device 342 for transmitting the carriage 322 to move in response to the driving force, and a second transmission device 343 for transmitting the transmission-mode light provider 311 to move in response to the driving force. When the driving motor 341 and the first transmission device 342 are accommodated in the lower housing 32, as shown in FIGS. 3A or 3B, the second transmission device 343 penetrates through the scanning platform 33 to connect the transmission-mode light provider 311 to the driving motor 341. It is possible, however, in some special case that the driving motor is positioned in the upper cover, and it is the first transmission device to penetrate through the scanning platform to connect the carriage to the driving motor. According to the present invention, the second transmission device 343 penetrates through the scanning platform 33 at the upper end 331 where the upper cover 31 is pivotally connected to the lower housing 32. Therefore, no extra space is required to create the through holes on the scanning platform for the penetration of the second transmission device 343.

Figure 3D:
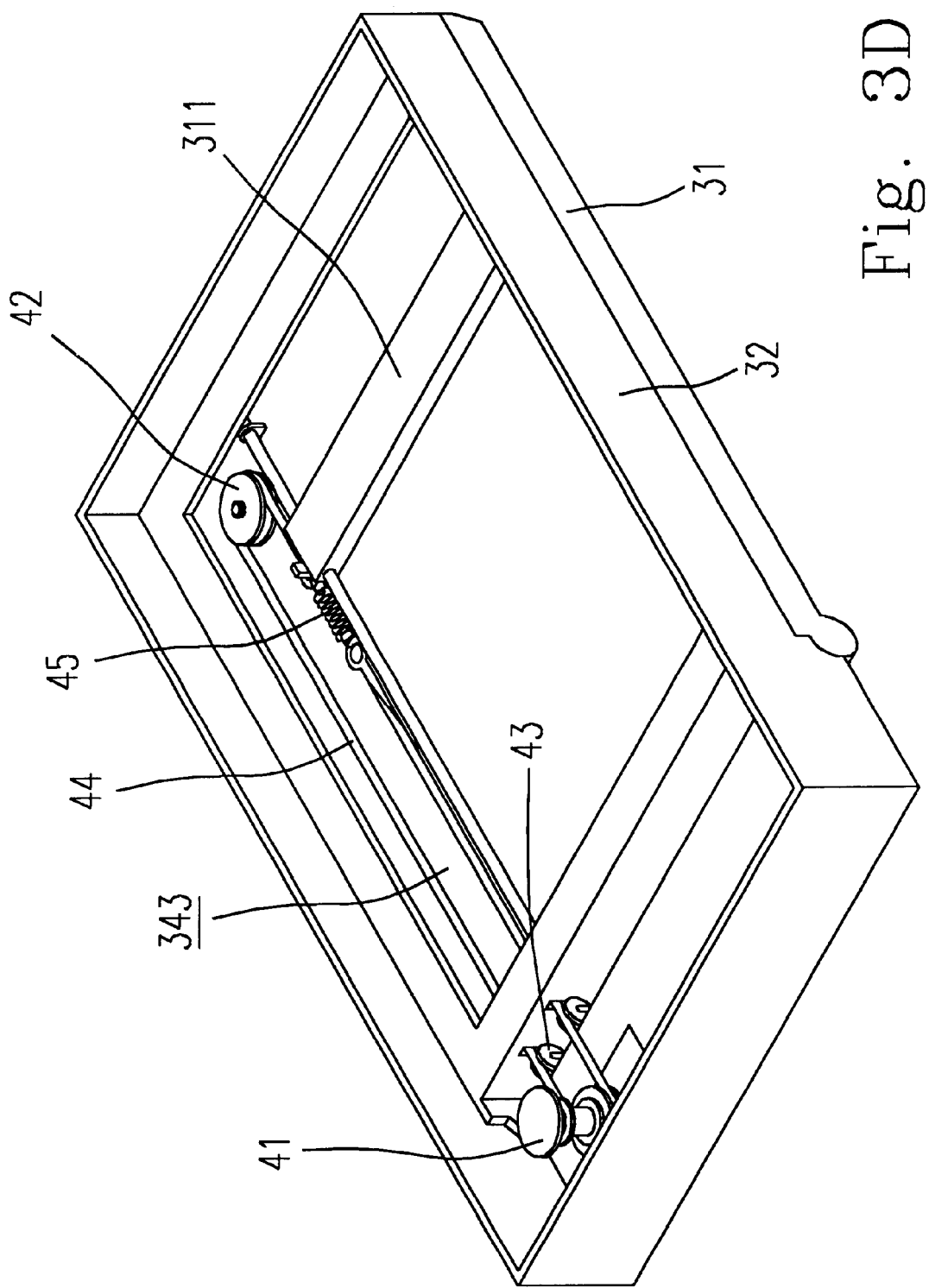
FIG. 3D is a bottom-up perspective view of a part of the image scanner of FIG. 3B schematically showing the transmission device penetrating through the scanning platform.

Referring to FIG. 3D, the second transmission device 343 includes a roller 41, a lying pulley 42, two upright pulleys 43 and a cyclic transmission line 44 which is flexible. The roller 41 is mounted in the lower housing 32 beneath the upper end 331 of the scanning platform 33, and driven to rotate by the motor 341. The pulley 42 is mounted in the upper cover 31 above a lower end 332 of the scanning platform opposite to the upper end 331. The cyclic transmission line 44 penetrates through the scanning platform 33 to hitch the pulley 42 and the roller 41. The transmission-mode light provider 311 is attached onto the cyclic transmission line 44 at a proper position for to-and-fro movement. The two upright pulleys 43 are positioned between the roller 41 and the lying pulley 42, and adjacent to the upper end 331 of the scanning platform 33 for sustaining there against the cyclic transmission line when the upper cover 31 is lifted, as shown in FIGS. 3A and 3D.

When the driving motor 341 drives the roller 41 to rotate in a specific direction, the cyclic transmission line 44 rotates with the roller 41, and further transmits the pulley 42 to rotate in the specific direction. Thereby, the transmission-mode light provider 311 moves across the document. When the driving motor 341 drives the roller 41 to rotate in an opposite direction, the cyclic transmission line 44 rotates with the roller 41, and further transmits the pulley 42 to rotate in the opposite direction. Thereby, the transmission-mode light provider 311 moves backwards to the home position.

In order to improve the tensile strength of the transmission line 44 so as to minimize vibration of the transmission-mode light provider 311 resulting from the driving force, a stretching spring element 45 is inserted into the cyclic transmission line 44 as a buffering device.

Figure 4A:
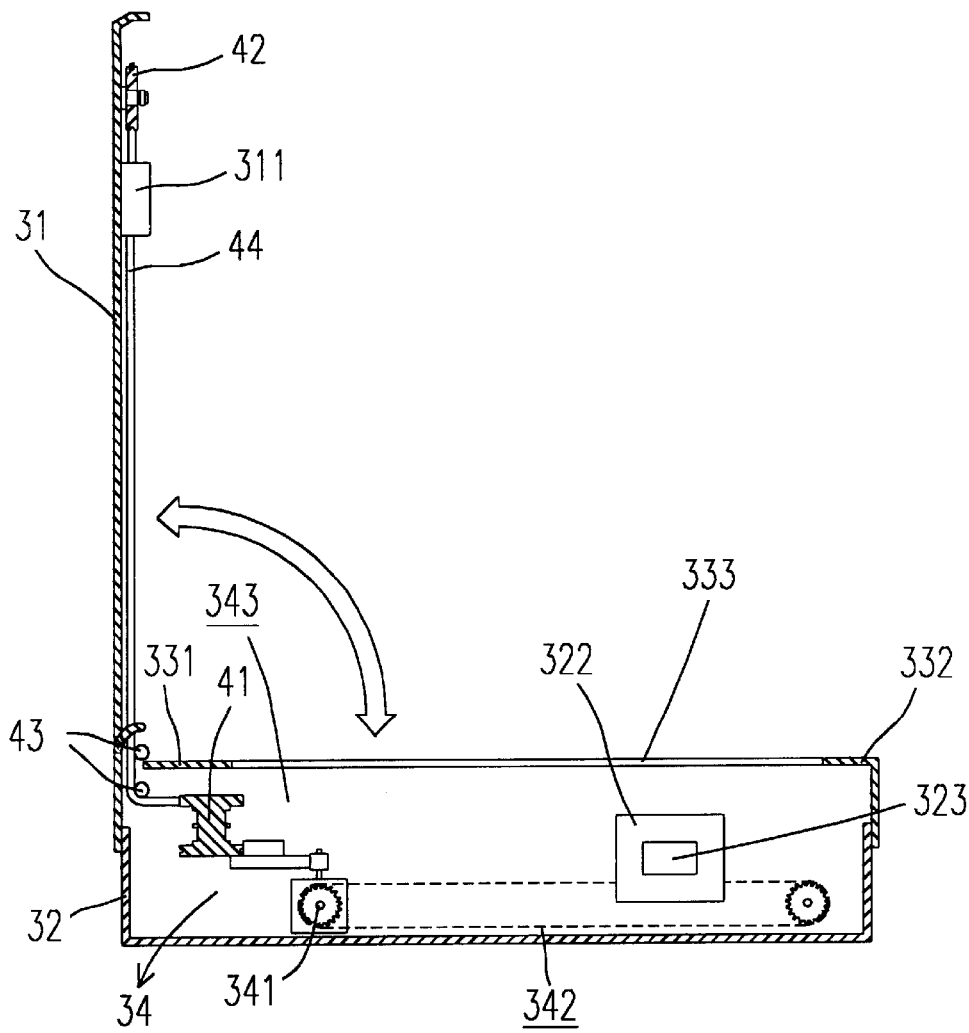
FIG. 4A is a schematic side view of another preferred embodiment of an image scanner according to the present invention, in which the upper cover is at an open position.
Figure 4B:
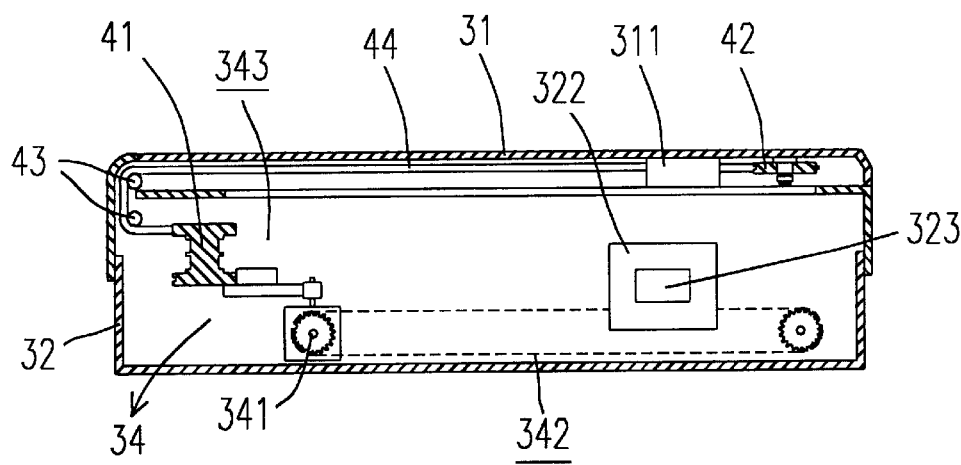
FIG. 4B is another schematic side view of the image scanner of FIG. 4A, in which the upper cover is at a closed position.

In the image scanner of FIGS. 3A~3D described as above, the transmission line 44 directly penetrates through the scanning platform 33 to connect the pulley 42 to the roller 41. Therefore, only two sustaining pulleys 43 are arranged to support the cyclic transmission line 44 when the upper cover 31 is lifted. In this embodiment, however, the lower housing 32 requires a space 46 in front of the document region 333 of the scanning platform 33 to accommodate the roller 41. If it is desirable that no such space 46 is present, the cyclic transmission line 44 may be bent first in the lower housing 32, then penetrate through the scanning platform at the upper end 331 of the scanning platform 33, and further bent when the upper cover 31 is put down, as shown in FIGS. 4A and 4B. Owing to two bent corners of the cyclic transmission line 44 in this embodiment, four sustaining pulleys 43 are preferably provided to support the transmission line 44. In fact, such a housing structure is relatively popular for current applications. In other words, the conventional cover and housing structures can be applied to the present invention with minor modification.

Figure 5A:
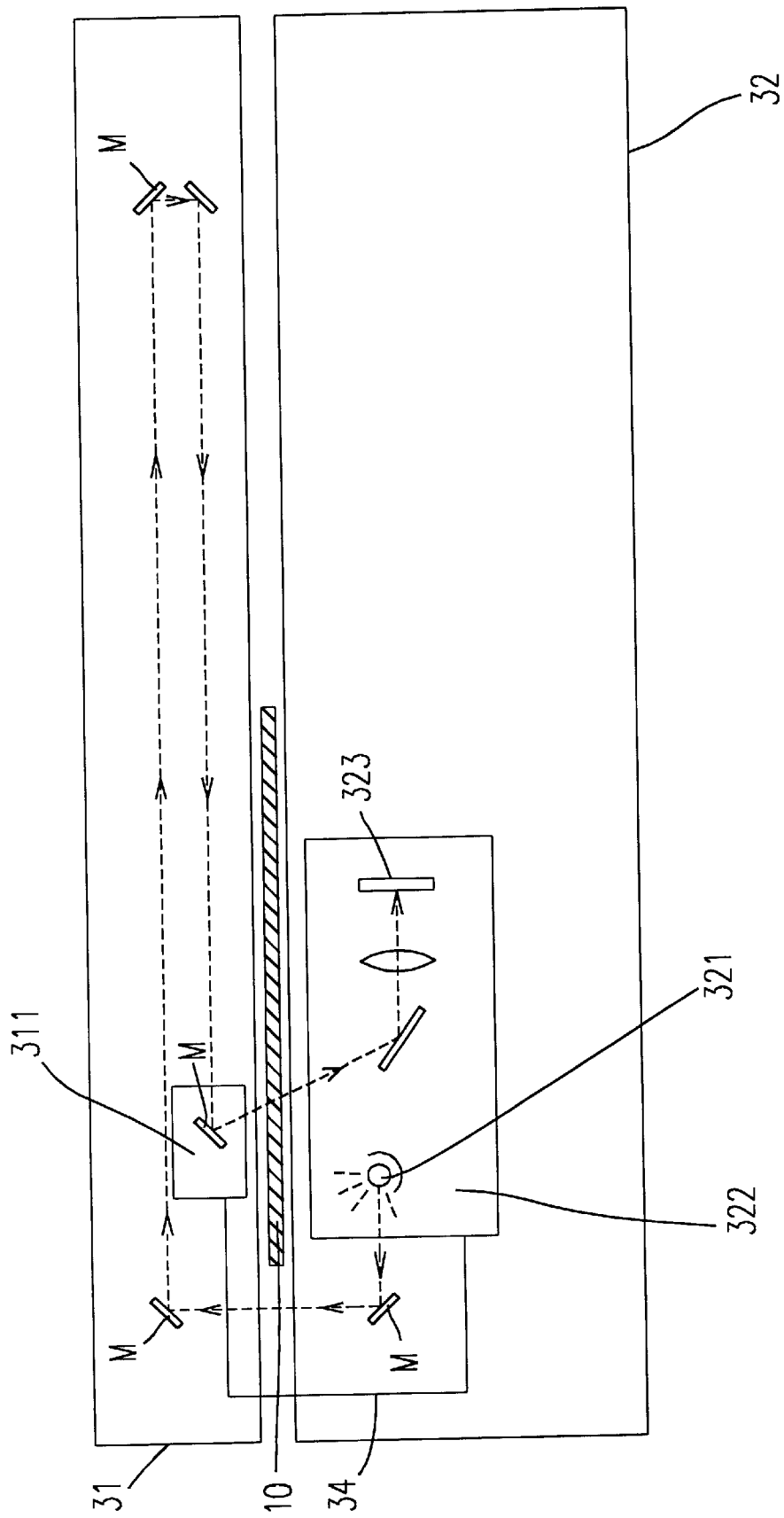
FIG. 5A is a schematic side view of another preferred embodiment of an image scanner according to the present invention, in which the reflection-mode light provider is a lamp and the transmission-mode light provider includes a set of mirrors.

In the above embodiments, the term "transmission-mode light provider" indicates a device for providing a light signal for the document to be scanned to perform a transmission-mode scanning operation. Generally, the light provider is a lamp. When scanning, the lamp is energized to emit light. The light penetrates the document and reaches the image pickup device to be sensed, thereby realizing image data of the document. No matter if transmission-mode scanning or dualmode scanning is performed, a transmission-mode light provider is required. However, for dual-mode scanning, the transmission-mode light provider does not have to be a lamp. It can include a series of arranged mirrors to reflect the light from the reflection-mode light provider to the document, as shown in FIG. 5A. The dash lines indicate the light trace for a transmission-mode scanning operation, from the reflection-mode light provider 321, which is a lamp mounted in the carriage 322, through the transmission-mode light provider 311, which consists of mirrors M, to the document 10, and further to the image pickup device 323. Of course, owing to the synchronous movement of the transmission-mode light provider 311 and the carriage 322 according to the present invention, the transmission-mode light provider 311 can receive the light from the reflection-mode light provider 321 precisely.

Figure 5B:
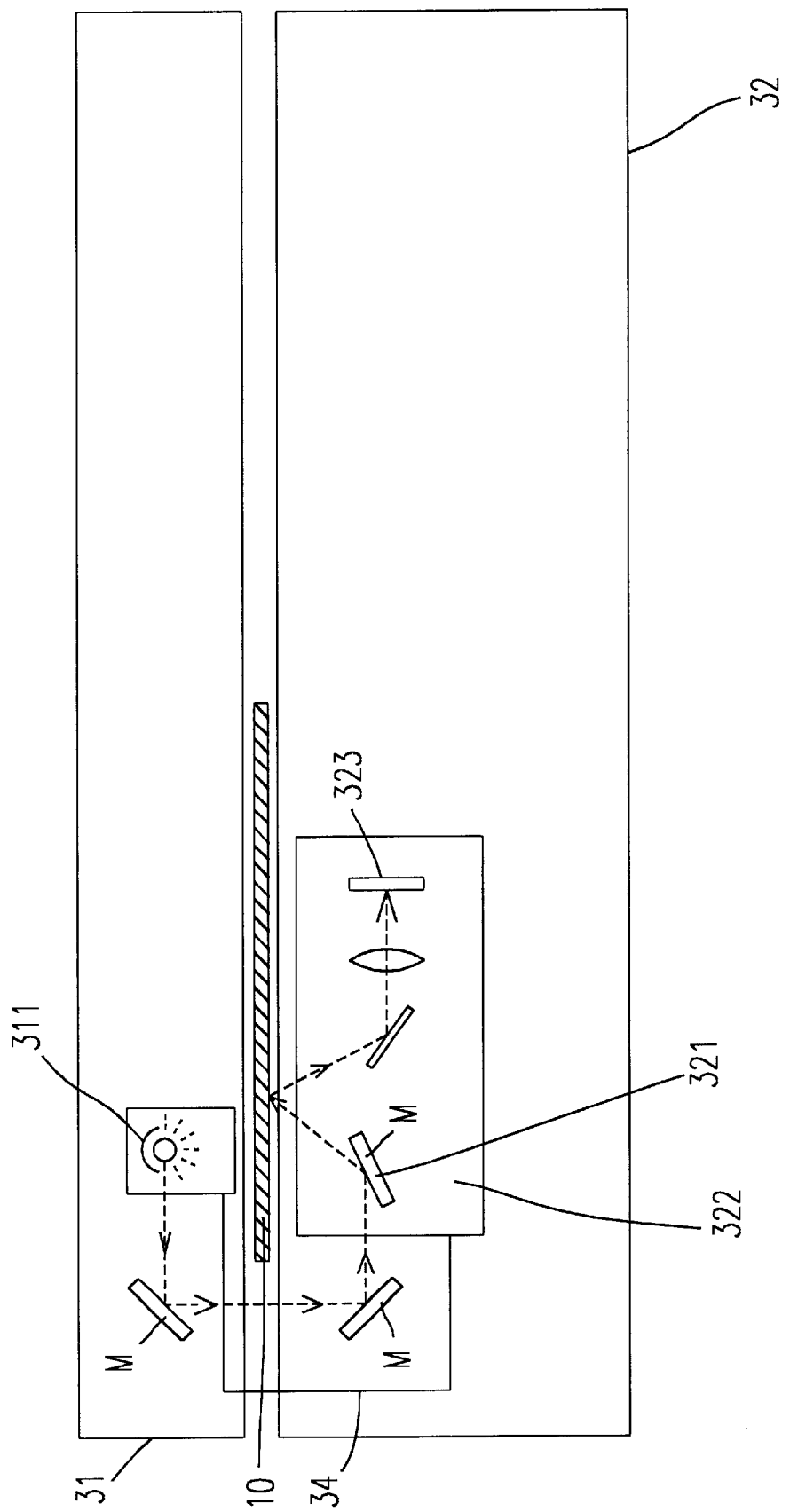
FIG. 5B is a schematic side view of another preferred embodiment of an image scanner according to the present invention, in which the transmission-mode light provider is a lamp and the reflection-mode light provider includes a set of mirrors.

Alternatively, it is feasible that the transmission-mode light provider 311 is a lamp and the reflection-mode light provider 321 includes a set of mirrors M, as shown in FIG. 5B. Likewise, for a reflection-mode scanning operation, the dash lines indicate the light trace from the transmission-mode light provider 311, which is a lamp, through the reflection-mode light provider 321, which consists of mirrors M, to the document 10, and further to the image pickup device 323. Owing to the synchronous movement of the transmission-mode light provider 311 and the carriage 322 according to the present invention, the reflection-mode light provider 321 can receive the light from the transmission-mode light provider 311 precisely.

Figure 5C:
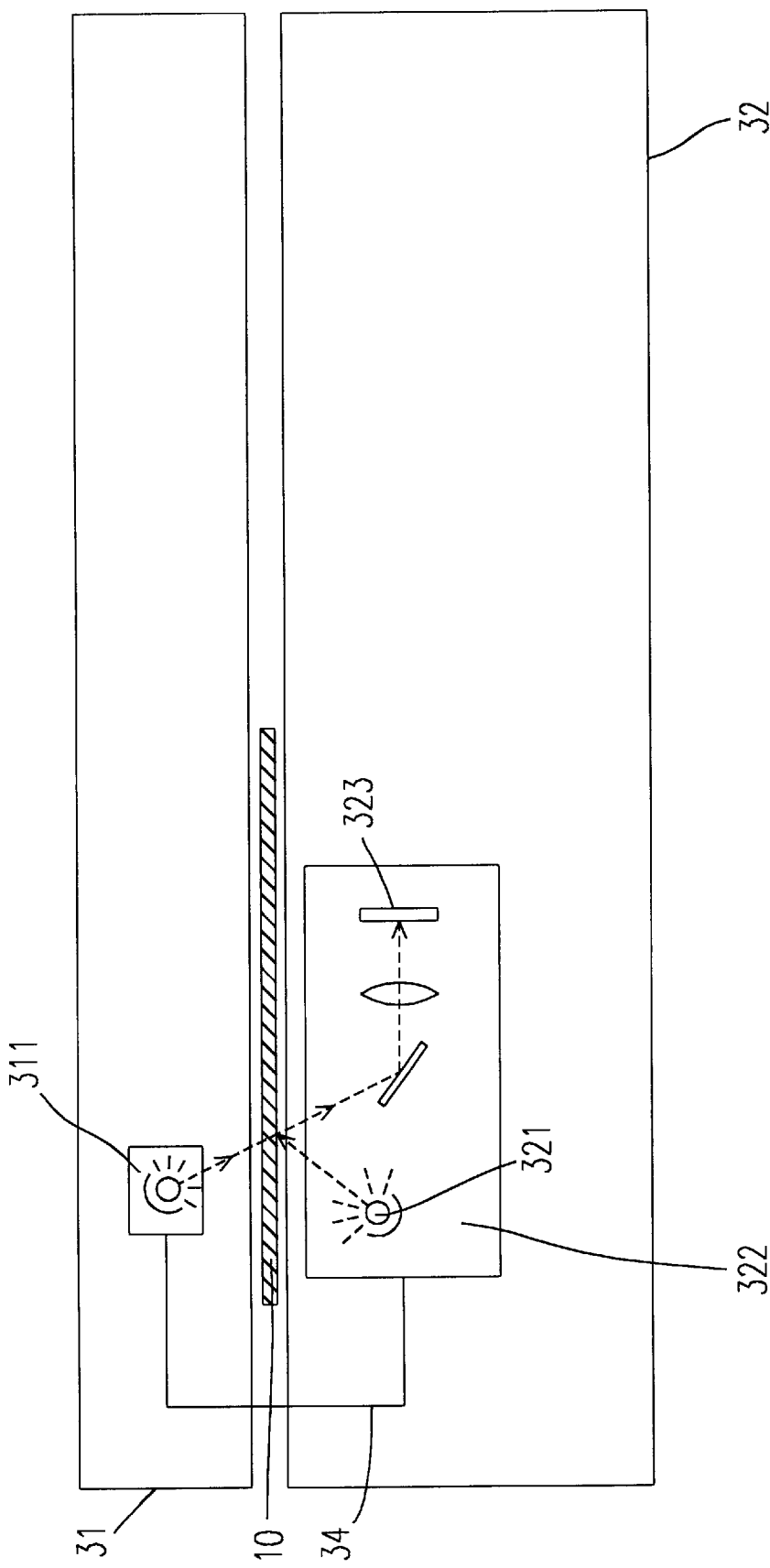
FIG. 5C is a schematic side view of another preferred embodiment of an image scanner according to the present invention, in which both of the reflection-mode and transmission-mode light providers are lamps.

Of course, the transmission-mode light provider 311 and the reflection-mode light provider 321 can both be lamps, and either one of which is energized for corresponding transmission-mode scanning or reflection-mode scanning, as shown in FIG. 5C.

According to the present invention, the transmission device for moving the light provider in the upper cover penetrates through the scanning platform at the upper end, so no guiding slots as the conventional image scanner has are created. Therefore, the width of the image scanner can be reduced. On the other hand, by using the present driving device, the movement of the transmission-mode light provider in the upper cover and that of the carriage in the lower housing, and vice versa, are perfectly synchronized.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An image scanner comprising:
   a scanning platform for placing thereon a document to be scanned;
   a scanner housing including a lower housing, and an upper cover pivotally connected to said lower housing at an upper end of said scanning platform;
   a transmission-mode light provider accommodated in said scanner housing for providing a light signal for said document to be scanned;
   an image pickup device accommodated in said scanner housing at a side of said scanning platform opposite to said transmission-mode light provider for receiving an image signal from said document in response to said light signal, and converting said image signal into an electronic signal; and
   a driving device connected between said transmission-mode light provider and said image pickup device for respectively moving said transmission-mode light provider and said image pickup device, said driving device including:
      a driving element for respectively providing a driving force for said transmission-mode light provider and said image pickup device;
      a first transmission device connected between said driving element and said image pickup device for moving said image pickup device in response to said driving force; and
      a second transmission device connected between said driving element and said transmission-mode light provider for moving said transmission-mode light provider in response to said driving force;
   wherein one of said first and said second transmission devices penetrates through said scanning platform at said upper end.

2. The image scanner according to claim 1 wherein said transmission-mode light provider is located in said upper cover, and said image pickup device is located in said lower housing.

3. The image scanner according to claim 2 wherein said driving element and said first transmission device are located in said lower housing, and said second transmission device penetrates through said scanning platform at said upper end.

4. The image scanner according to claim 3 wherein said driving element is a motor.

5. The image scanner according to claim 4 wherein said second transmission device includes:
   a roller mounted in said lower housing beneath said upper end of said scanning platform, and driven to rotate by said motor;
   a first pulley mounted in said upper cover above a lower end of said scanning platform opposite to said upper end; and
   a cyclic transmission line penetrating through said scanning platform, attached thereto said transmission-mode light provider, hitching said first pulley and said roller, and rotating with said roller with the aid of said first pulley for moving said transmission-mode light provider across said scanning platform.

6. The image scanner according to claim 5 wherein said cyclic transmission line is made of a flexible material.

7. The image scanner according to claim 6 wherein said second transmission device further includes two second pulleys arranged between said roller and said first pulley and adjacent to said upper end of said scanning platform for sustaining thereagainst said cyclic transmission line when said upper cover is lifted.

8. The image scanner according to claim 7 wherein said second transmission device further includes a buffering device inserted as a part of said cyclic transmission line for improving the tensile strength of said cyclic transmission line so as to minimize vibration of said transmission-mode light provider resulting from said driving force.

9. The image scanner according to claim 8 wherein said buffering device is a stretching spring element.

10. The image scanner according to claim 1 wherein said image pickup device is mounted in a carriage which is connected to and moved by said first transmission device.

11. The image scanner according to claim 10 further comprising a reflection-mode light provider mounted in said carriage.

12. The image scanner according to claim 11 wherein said transmission-mode light provider includes a first lamp energized to provide said light signal for said document when a transmission-mode scanning operation is performed, and said reflection-mode light provider includes a second lamp energized to provide said light signal for said document when a reflection-mode scanning operation is performed.

13. The image scanner according to claim 11 wherein said transmission-mode light provider includes a first lamp energized to provide said light signal for said document when a transmission-mode scanning operation is performed, and said reflection-mode light provider includes a mirror set reflecting light from said first lamp to said document as said light signal when a reflection-mode scanning operation is performed.

14. The image scanner according to claim 11 wherein said reflection-mode light provider includes a second lamp energized to provide said light signal for said document when a reflection-mode scanning operation is performed, and said transmission-mode light provider includes a mirror set reflecting light from said second lamp to said document as said light signal when a reflection-mode scanning operation is performed.

* * * * *